(12) United States Patent
Kurita et al.

(10) Patent No.: US 8,513,800 B2
(45) Date of Patent: Aug. 20, 2013

(54) SEMICONDUCTOR DEVICE AND METHOD FOR MANUFACTURING THE SAME

(75) Inventors: Takaki Kurita, Kawasaki (JP); Osamu Igawa, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 888 days.

(21) Appl. No.: 11/882,266

(22) Filed: Jul. 31, 2007

(65) Prior Publication Data

US 2008/0067671 A1 Mar. 20, 2008

(30) Foreign Application Priority Data

Sep. 19, 2006 (JP) ................................. 2006-252899

(51) Int. Cl.
*H01L 23/10* (2006.01)

(52) U.S. Cl.
USPC ..... 257/707; 257/706; 257/703; 257/E21.536

(58) Field of Classification Search
USPC ................... 257/E21.536, 707, 706
See application file for complete search history.

(56) References Cited

U.S. PATENT DOCUMENTS

| | | | | |
|---|---|---|---|---|
| 5,396,403 | A * | 3/1995 | Patel .............................. | 361/705 |
| 6,461,891 | B1 | 10/2002 | Dishongh et al. | |
| 6,515,360 | B2 * | 2/2003 | Matsushima et al. ......... | 257/704 |
| 6,774,298 | B2 | 8/2004 | Tauchi et al. | |
| 6,882,043 | B2 | 4/2005 | Dishongh et al. | |
| 2002/0020912 | A1 | 2/2002 | Dishongh et al. | |
| 2002/0149896 | A1 | 10/2002 | Tauchi et al. | |
| 2002/0151110 | A1 * | 10/2002 | Dishongh et al. ............. | 438/122 |
| 2005/0199371 | A1 | 9/2005 | Kemink et al. | |
| 2006/0227510 | A1 * | 10/2006 | Fitzgerald et al. ............ | 361/704 |
| 2007/0012477 | A1 * | 1/2007 | Nakamura et al. ............ | 174/260 |

FOREIGN PATENT DOCUMENTS

| | | |
|---|---|---|
| CN | 1373903 A | 9/2002 |
| JP | 52-61152 A | 5/1977 |
| JP | 54-132774 A | 10/1979 |
| JP | 63-192250 A | 8/1988 |

(Continued)

OTHER PUBLICATIONS

Korean Office Action dated Dec. 21, 2007, Application No. 10-2007-0004280.
Chinese Office Action dated Feb. 6, 2009, issued in corresponding Chinese Patent Application No. 200710146867.8.
"Taiwanese Office Action" mailed by Taiwan Patent Office and corresponding to Taiwanese application No. 96127791 on Feb. 21, 2011, with English translation.
Japanese Office Action mailed Feb. 21, 2012 for corresponding Japanese Application No. 2006-252899, with Partial English-language Translation.

*Primary Examiner* — Junghwa M Im
(74) *Attorney, Agent, or Firm* — Fujitsu Patent Center (57) ABSTRACT

After a semiconductor chip is cut out, an In-10 atom % Ag pellet is placed on a metal film. Next, an epoxy sheet on a stiffener is stuck to a ceramic substrate. At this time, the In alloy pellet is sandwiched between a central protrusion portion and the metal film. Then, an In alloy film is formed from the In alloy pellet by heating, melting, and then cooling the In alloy pellet. As a result, the semiconductor chip and a heat spreader are bonded via the metal film and the In alloy film.

6 Claims, 7 Drawing Sheets

(56) References Cited

FOREIGN PATENT DOCUMENTS

| | | |
|---|---|---|
| JP | 63-228650 A | 9/1988 |
| JP | 5-144966 | 6/1993 |
| JP | 5-275580 A | 10/1993 |
| JP | 621278 A | 1/1994 |
| JP | 7-106477 A | 4/1995 |
| JP | 2002-232022 A | 8/2002 |
| JP | 2004-265972 A | 9/2004 |
| JP | 2005-217003 A | 8/2005 |
| JP | 2006-108296 A | 4/2006 |
| KR | 2002-35870 | 5/2002 |
| TW | 200531232 | 9/2005 |
| WO | 01/20673 A1 | 3/2001 |

* cited by examiner

SEMICONDUCTOR DEVICE AND METHOD FOR MANUFACTURING THE SAME

CROSS-REFERENCE TO RELATED APPLICATIONS

This application is based upon and claims the benefit of priority from the prior Japanese Patent Application No. 2006-252899, filed on Sep. 19, 2006, the entire contents of which are incorporated herein by reference.

BACKGROUND OF THE INVENTION

1. Field of the Invention

The present invention relates to a semiconductor device which has aimed to improve heat dissipation efficiency and a method for manufacturing the same.

2. Description of the Related Art

In an IC package packing a semiconductor chip in the package, there is a case where a heat spreader is provided in order to efficiently dissipate heat from the semiconductor chip to the outside (for example, refer to Patent Document 1). A heat spreader is sometimes called a heat sink. Further, a heat spreader is sometimes used in a system-in-package (SIP) packing a plurality of semiconductor chips and peripheral circuit parts in a package.

In general, a heat spreader is bonded to the backside of a semiconductor chip. For the bonding, solder (PbSn) is used. Then, heat produced from the semiconductor chip is conducted to the heat spreader and the heat is dissipated to the outside by natural cooling or forced cooling.

Consequently, it is required for the thermal conductivity to be high from the semiconductor chip to the heat spreader because the heat from the semiconductor chip is dissipated at high efficiency. On the other hand, accompanying the recent advancement of the function of the semiconductor chip, the quantity of produced heat is increased. Because of this, a structure is demanded which is capable of realizing higher heat conductivity.

Related arts are disclosed in Patent Document 1 (Japanese Patent Application Laid-open No. 2006-108296), Patent Document 2 (Japanese Patent Application Laid-open No. Sho 52-61152), Patent Document 3 (Japanese Patent Application Laid-open No. Sho 63-228650), and Patent Document 4 (Japanese Patent Application Laid-open No. Sho 54-132774).

SUMMARY OF THE INVENTION

An object of the present invention is to provide a semiconductor device capable of improving dissipation efficiency and a method for manufacturing the same.

The inventors of the present invention have hit upon a variety of aspects of the present invention shown below after keen examination to solve the above-mentioned problem.

A semiconductor device according to the present invention is provided with a semiconductor chip, a substrate that mounts the semiconductor chip, and a heat diffusion member arranged over the semiconductor chip and the substrate. Then, the semiconductor chip and the heat diffusion member are bonded with an In alloy film.

In a method for manufacturing a semiconductor device according to the present invention, a semiconductor chip is mounted over a substrate and then, a heat diffusion member is bonded onto the semiconductor chip and the substrate with an In alloy film on the semiconductor chip.

DETAILED DESCRIPTION OF THE PREFERRED EMBODIMENTS

Embodiments of the present invention will be described specifically with reference to accompanied drawings. By the way, for convenience, the structure of a semiconductor device will be described along with its manufacturing method.

First Embodiment

A first embodiment of the present invention will be described first. FIGS. 1A to 1I are section views showing a method for manufacturing a semiconductor device according to the first embodiment of the present invention in the order of steps.

Figure 1A:
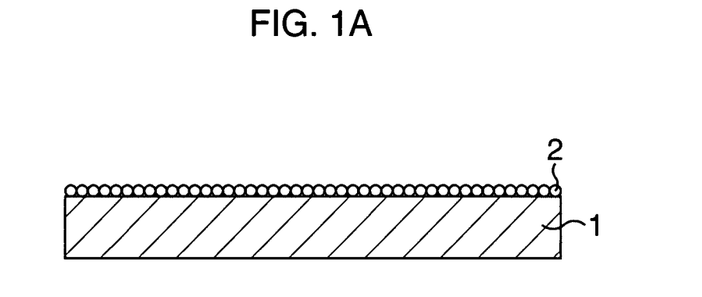
FIGS. 1A to 1I are diagrams showing a method for manufacturing a semiconductor device according to a first embodiment of the present invention in the order of steps.

In the first embodiment, formation of an insulating film, a semiconductor film, a conductive film, etc., onto the surface of a circular disc-like semiconductor substrate 1 and thermal processing and the like are performed first. In FIGS. 1A to 1I and the following description, it is assumed for convenience that the insulating film, the semiconductor film, the conductive film, etc., are included in the semiconductor substrate 1. Next, as shown in FIG. 1A, conductive bumps 2 are formed on the surface of the semiconductor substrate 1.

Figure 1B:
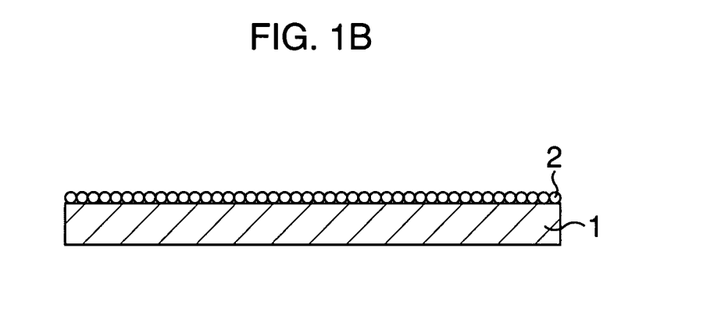

Next, as shown in FIG. 1B, the backside of the semiconductor substrate 1 is polished. The thickness of the semiconductor substrate 1 after polishing is adjusted to, for example, about 100 μm to 600 μm. The average roughness Ra of the backside after polishing is adjusted to, for example, about 25 nm.

Figure 1C:
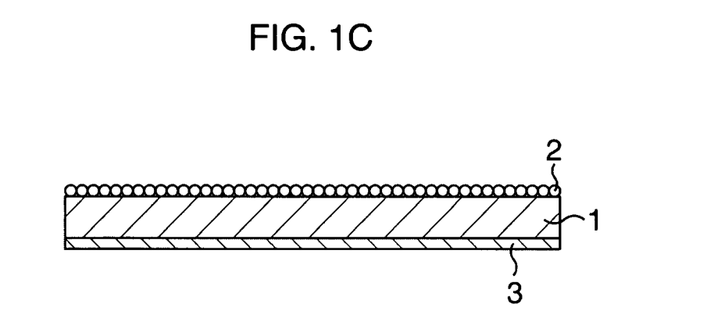

Then, as shown in FIG. 1C, a metal film 3 is formed on the backside of the semiconductor substrate 1. As the metal film 3, for example, a Ti film, a Cu film, a Ni film, or a Ag film is formed as a single layer, or these films are laminated. In addition, it may also be possible to use an alloy film consisting of two or more kinds of Ti, Ni, Pd, V, and Ag as the whole or a part of the metal film 3. Further, it may also be possible to use a WTi film, a NiCr film, a CrTi film or the like as the whole or a part of the metal film 3. The thickness of the metal film 3 is adjusted to, for example, about 50 nm to 500 nm.

Figure 1D:
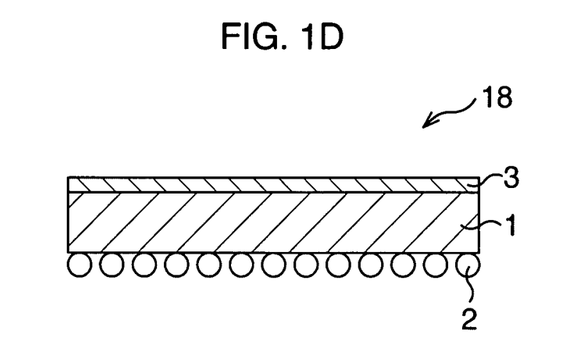

Subsequently, as shown in FIG. 1D, by dicing the circular disc-like semiconductor substrate 1, a plurality of semiconductor chips 18 are cut out. The plane shape of the semiconductor chip 18 is a rectangle with a side-length of, for example, about 15 mm to 20 mm. In FIGS. 1D to 1I, the surface of the semiconductor substrate 1 is drawn so as to face downward and the backside, to face upward.

Figure 1E:
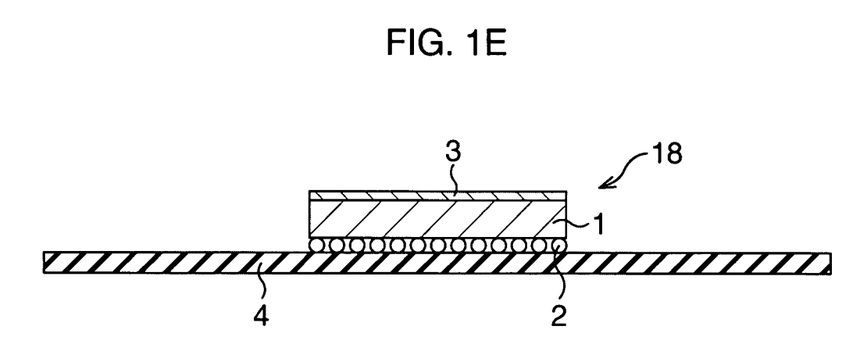

Next, as shown in FIG. 1E, the semiconductor chip 18 is placed on a ceramic substrate 4 inside which wirings are formed with the bumps 2 facing downward.

Figure 1F:
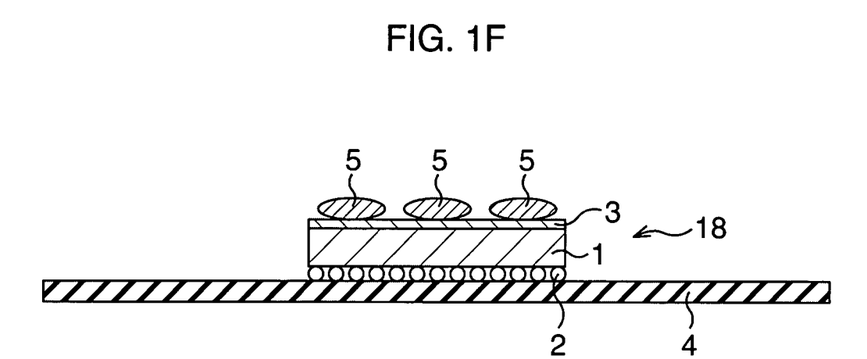

Subsequently, as shown in FIG. 1F, an In alloy pellet 5 is placed on the metal film 3. The In alloy pellet 5 is composed of, for example, InSn, InPb, InBi, or InAg. In alloy pellets 5 may be placed on the metal film 3 dispersedly as shown in FIG. 1F, or one alloy pellet 5 may be placed evenly on the metal film 3 without dispersion.

Figure 2:
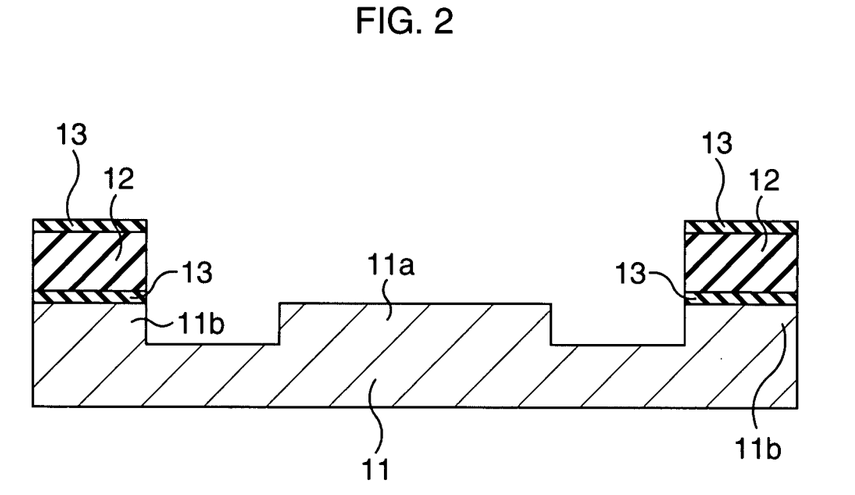
FIG. 2 is a diagram showing a heat spreader.
Figure 3:
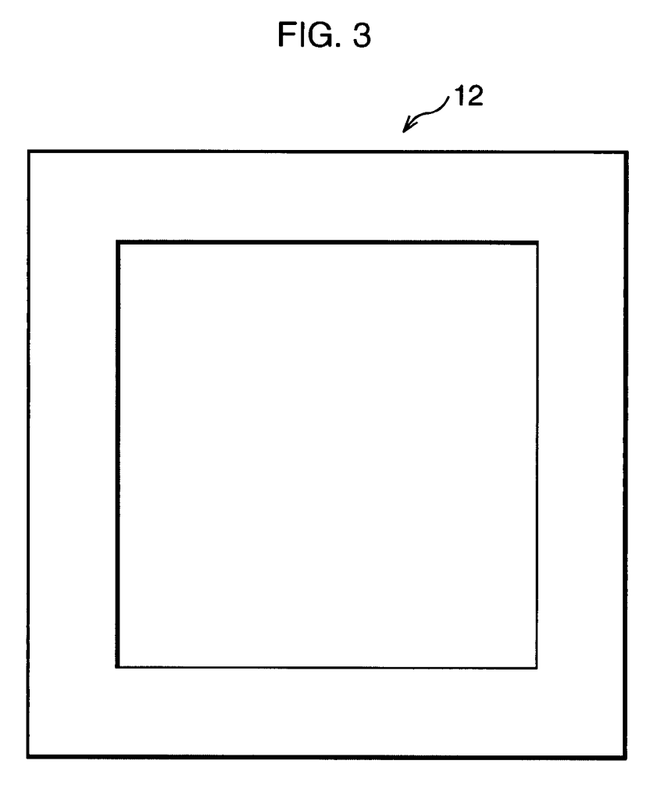
FIG. 3 is a diagram showing a stiffener.

In addition, as shown in FIG. 2, preparations are made for bonding of a heat spreader 11. The plane shape of the heat spreader 11 is, for example, a rectangle slightly smaller than the plane shape (for example, a rectangle) of the ceramic substrate 4. In the heat spreader 11, as shown in FIG. 2, a central protrusion portion 11a to be bonded to the semiconductor chip 18, and a peripheral protrusion portion 11b along the outer circumferential portion are formed. Then, in the preparations for bonding, a stiffener 12 is fixed onto the peripheral protrusion portion 11b using an epoxy sheet 13 having adhesive properties on its both sides and further, the epoxy sheet 13 is stuck on the other surface of the stiffener 12. The plane shape of the stiffener 12 is substantially the same as that of the peripheral protrusion portion 11b, as shown in FIG. 3. The stiffener 12 is made of, for example, a solid resin.

Figure 1G:
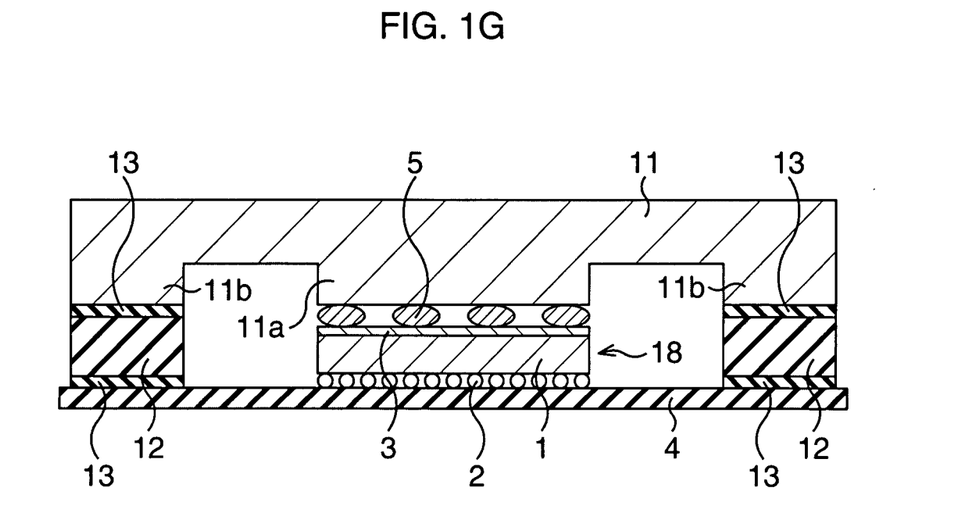

Then, as shown in FIG. 1G, the epoxy sheet 13 on the stiffener 12 is stuck on the ceramic substrate 4. At this time, the In alloy pellet 5 is sandwiched between the central protrusion portion 11a and the metal film 3. Then, by heating the epoxy sheet 13 to about 70° C., the heat spreader 11, the stiffener 12, and the ceramic substrate 4 are temporarily fixed (temporarily cured).

Figure 1H:
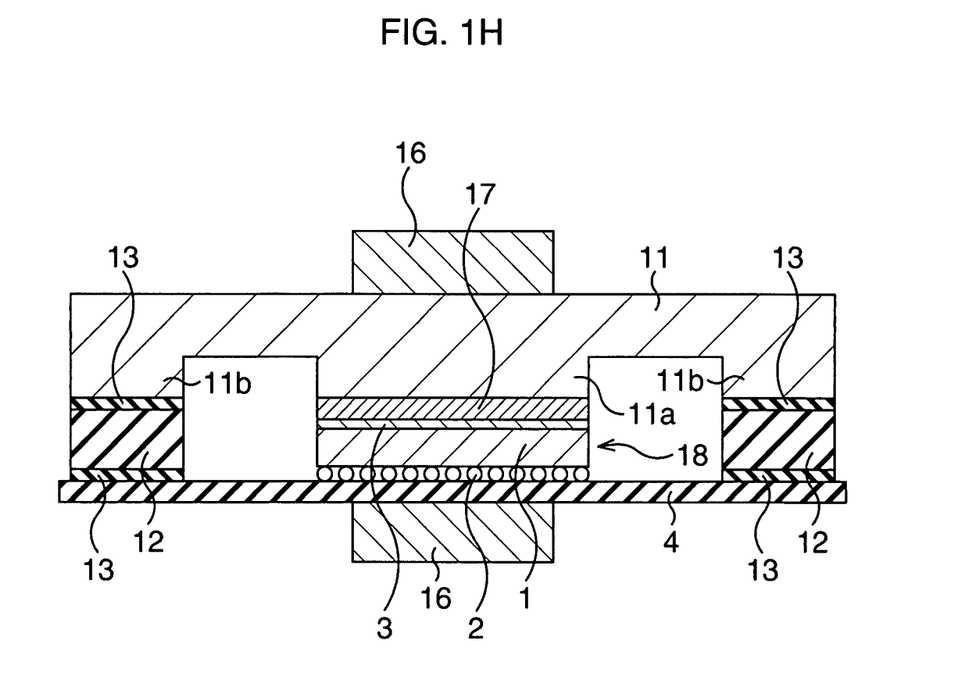

Next, as shown in FIG. 1H, the heat spreader 11 and the ceramic substrate 4 are sandwiched by a clip 16. Then, by heating the In alloy pellet 5 to melt it and then cooling it, an In alloy film 17 is formed from the In alloy pellet 5. As a result, the semiconductor chip 18 and the heat spreader 11 are bonded via the metal film 3 and the In alloy film 17. Incidentally, the maximum temperature achieved when heating is adjusted to, for example, about 250±10° C. In addition, the heating is performed by using, for example, a conveyor furnace. Further, by heating the epoxy sheet 13 with the clip 16 attached thereto, the actual curing of the epoxy sheet 13 is performed. Incidentally, the heating is performed by using, for example, a temperature-controlled bath and the temperature is set to, for example, about 150±5° C., and the heating time is set to, for example, about one hour.

Preferably, the amount of the In alloy pellet 5 is adjusted so that the In alloy film 17 has a thickness of about 0.1 mm to 0.8 mm. It is required that a sufficient bonding strength be obtained and its thickness be large enough to prevent the alloy from overflowing or flowing out during the period of formation.

Figure 1I:
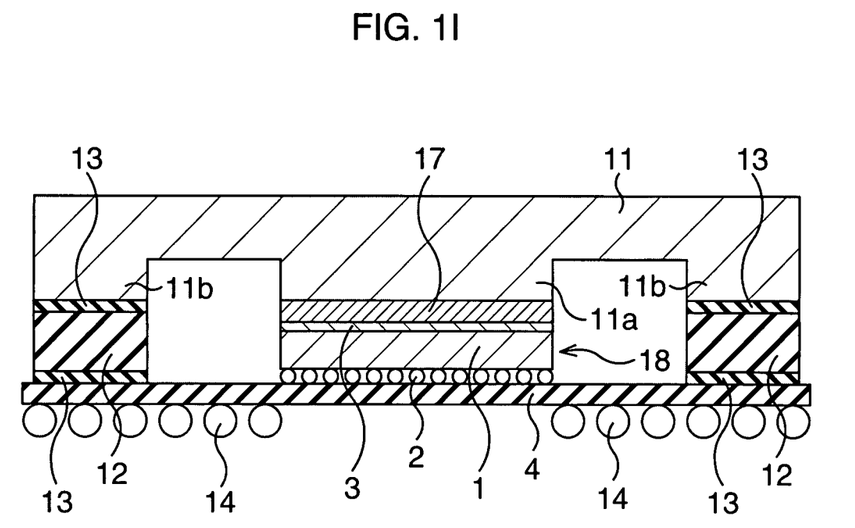
Figure 4:
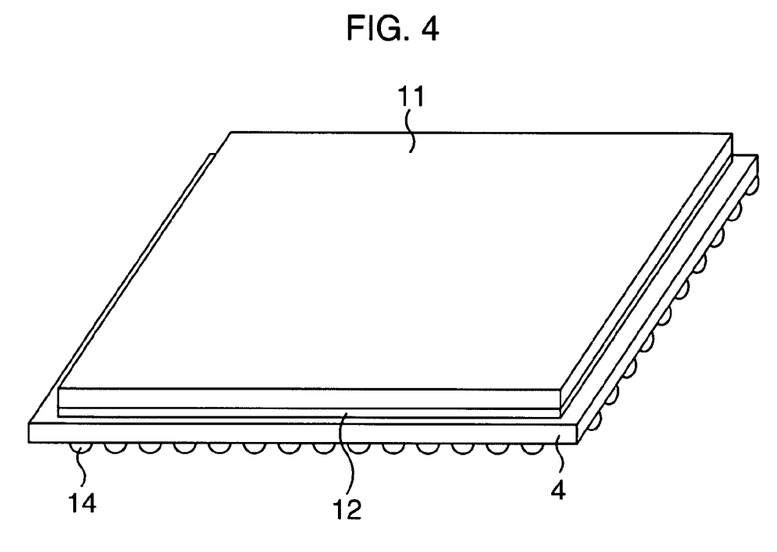
FIG. 4 is a perspective view showing a semiconductor device according to the first embodiment.

Next, as shown in FIG. 1I, the clip 16 is removed. After this, solder balls 14 are formed on the outer surface of the ceramic substrate 4. The temperature when the solder ball 14 is formed is set to, for example, about 250±10° C. As a result, the semiconductor device as shown in FIG. 4 is completed.

According to the first embodiment described above, since the In alloy film 17 is used to bond the heat spreader 11 and the semiconductor chip 18, the thermal conductivity from the semiconductor chip 18 to the heat spreader 11 will be excellent. This is also backed up by the fact that the wettability of the In alloy in a melted state on the metal film 3 is high.

Preferably, the ratio of Sn, Pb, Bi, or Ag in the In alloy constituting the In alloy pellet 5 is about 0.1 atom % to 20 atom %. When the ratio of Sn, Pb, Bi, or Ag is less than 0.1 atom %, the melting point of the In alloy is low and there is a possibility of melting of the In alloy film 17 accompanying the heat generation of the semiconductor chip 18. On the other hand, when the ratio exceeds 20 atom %, there may be a case where it is difficult to maintain sufficient wettability. In particular, in the case of InAg, preferably, the ratio of Ag is 5 atom % to 20 atom % and, most preferably, 10 atom % to 20 atom %.

While the thermal conductivity of the conventional Pb-63% Sn, in which the ratio of Sn is 63 atom %, at 85° C. is 0.49 (W/cm° C.), the thermal conductivity of the In-10% Ag, in which the ratio of Ag is 10 atom %, at 85° C. is 0.67 (W/cm° C.). As described above, it is possible to obtain an excellent thermal conductivity. Consequently, it is possible to obtain a semiconductor device having an excellent heat dissipation effect. Incidentally, the operation temperature of the recent semiconductor chip with high capabilities is about 100° C. to 150° C. On the other hand, the melting point of the In-10% Ag is about 230° C. to 240° C. Consequently, the In-10% Ag film is stable against the heat generation of the semiconductor chip.

In addition, the material of the heat spreader is not limited in particular, however, preferably, the thermal conductivity is equal to or higher than 2 (W·cm$^{-1}$·k$^{-1}$). As such a material, for example, Cu, Al, Au, etc. are exemplified. The thermal conductivities of Cu, Al, and Au are 4.01, 3.17, and 2.37 (W·cm$^{-1}$·k$^{-1}$), respectively. Then, as the heat spreader, for example, a base material of Cu plated with Au, or a base material of Al—SiC in which a Au film or an Al film is formed on a bonded portion with the In alloy film, or the like can be used.

Second Embodiment

Next, a second embodiment of the present invention will be described. FIGS. 5A to 5D are section views showing a method for manufacturing a semiconductor device according to the second embodiment of the present invention in the order of steps.

Figure 5A:
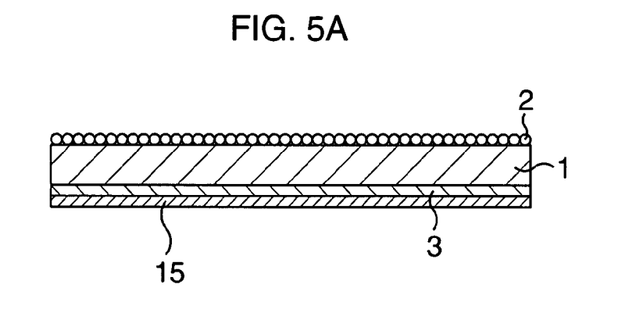
FIGS. 5A to 5D are diagrams showing a method for manufacturing a semiconductor device according to a second embodiment of the present invention in the order of steps.

In the second embodiment, first, as in the first embodiment, the processing until the formation of the metal film 3 is performed (FIG. 1C). Next, as shown in FIG. 5A, an In alloy sheet 15 is overlapped beneath the metal film 3 and temporarily fixed. The components of the In alloy sheet 15 are the same as those of the In alloy pellet 5 in the first embodiment.

Figure 5B:
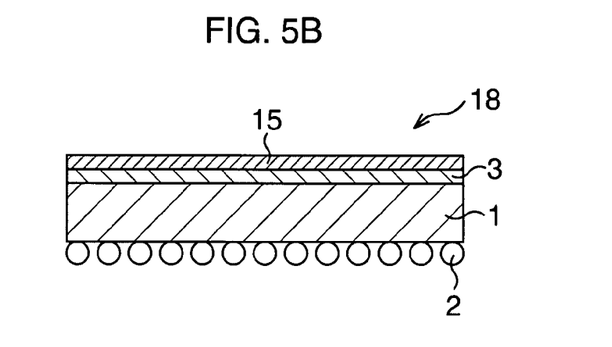
Figure 5C:
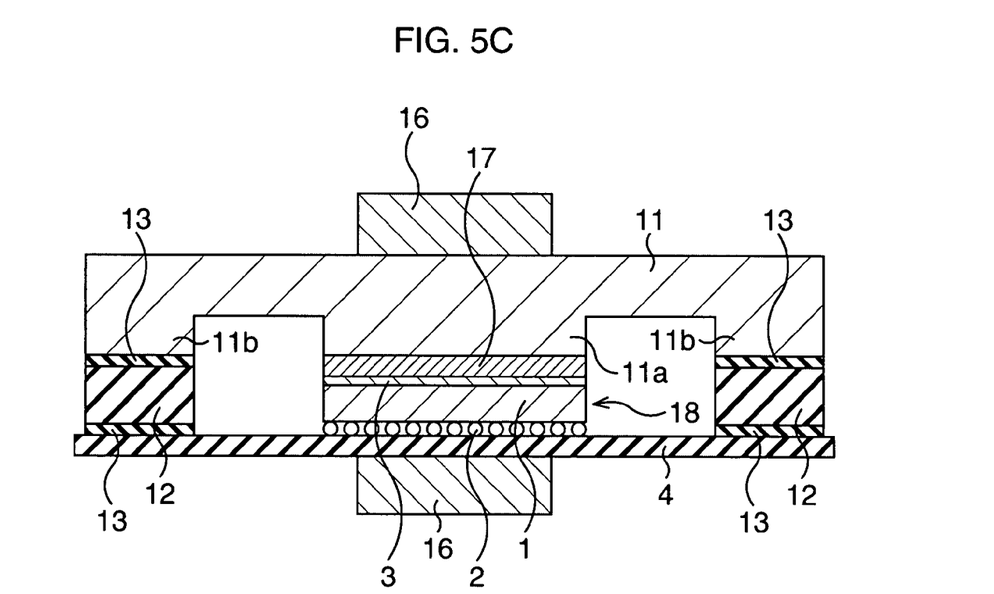
Figure 5D:
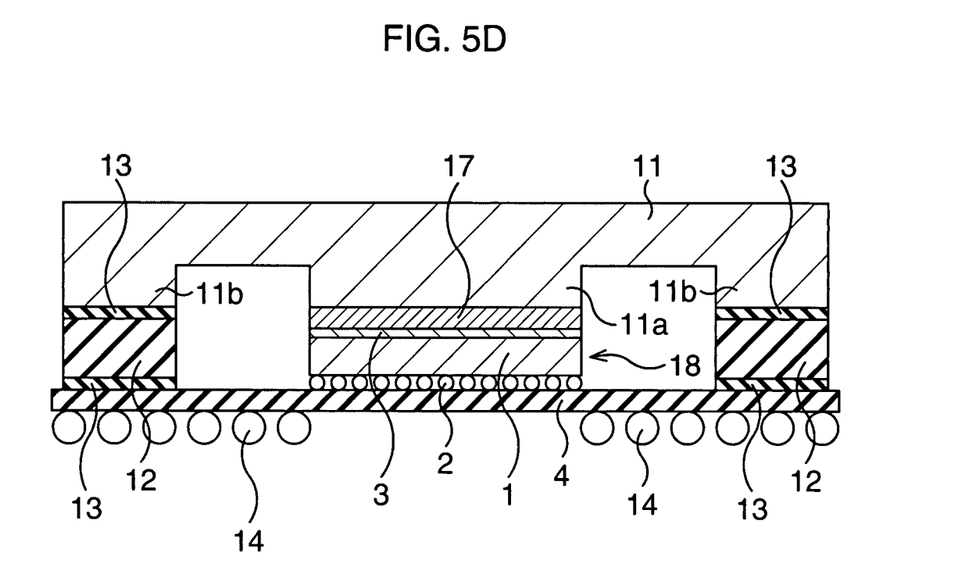

Next, as shown in FIG. 5B, by dicing the circular disc-like semiconductor substrate 1, the plurality of semiconductor chips 18 are cut out. The plane shape of the semiconductor chip 18 is, for example, a rectangle with a side-length of, for example, about 15 mm to 20 mm. In FIGS. 5B to 5D, the surface of the semiconductor substrate 1 is drawn so as to face downward and the backside, to face upward.

Then, as shown in FIG. 5C, as in the first embodiment, the processings from the placing of the semiconductor chip 18 onto the ceramic substrate 4 (FIG. 1E) to the actual curing of the epoxy sheet 13 (FIG. 1H) are performed.

Figure 6:
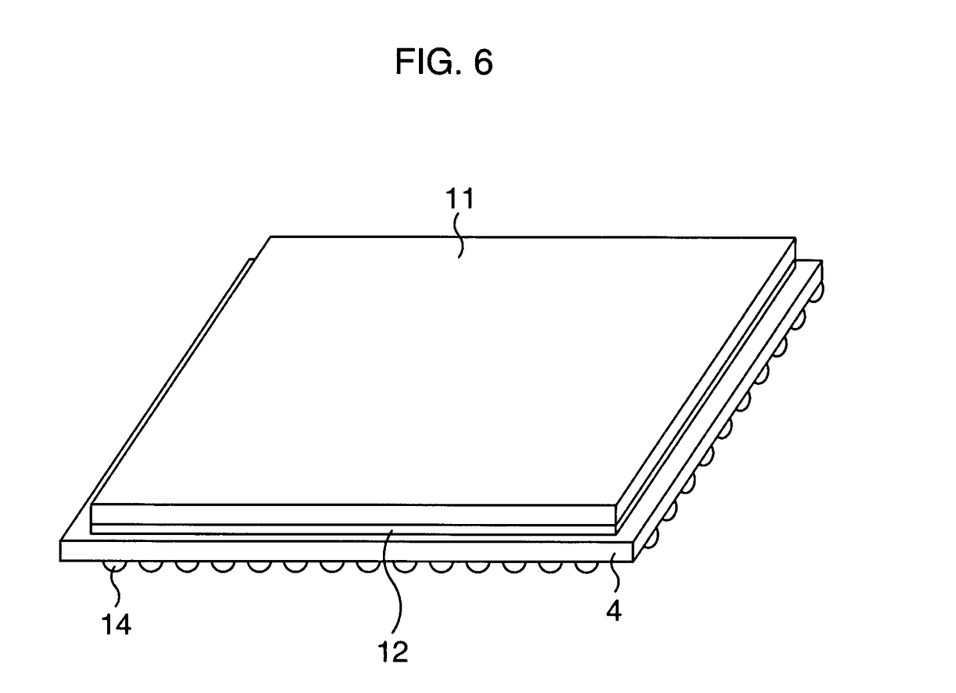
FIG. 6 is a perspective view of the semiconductor device according to the second embodiment.

Next, as shown in FIG. 5D, the clip 16 is removed and the solder balls 14 are formed on the outer surface of the ceramic substrate 4. As in the first embodiment, the temperature when the solder ball 14 is formed is set to, for example, 250±10° C. As a result, the semiconductor device as shown in FIG. 6 is completed.

By the second embodiment as described above, the same effects as those in the first embodiment can be obtained.

Next, the experiment actually conducted by the inventors of the present invention will be described. In this experiment, the evaluation of the melting properties (lubrication behavior) of the In alloy for the metal film formed on the backside of the semiconductor chip, the evaluation based on the scratching test, and the evaluation of the bonding strength were made.

For the evaluation of the melting properties, the In-10% Ag pellet was placed on the metal film formed on the backside of the semiconductor chip, the In-10% Ag pellet was melted using the reflow furnace, and then cooled, and the evaluation of how wettability spread was made visually. At this time, various metal films were formed on the backside of the semiconductor chip. In addition, in the scratching test, the solidified In-10% Ag film was scratched and whether the film peeled off from the metal film was investigated. As a comparison material, the same evaluations using the Pb-63% Sn pellet were also made. Then, evaluations were made based on the standards shown in Table 1. The result of the evaluation is shown in Table 2.

TABLE 1

| JUDGEMENT | MELTING PROPERTIES | SCRATCHING TEST |
|---|---|---|
| ◎ | EXTREMELY EXCELLENT | NO PEELING OF FILM |
| ○ | EXCELLENT | |
| Δ | | PEELING OF FILM |
| x | POOR (SHED) | |

TABLE 2

| | In - 10% Ag | | Pb - 63% Sn | |
|---|---|---|---|---|
| METAL FILM | JUDGEMENT RESULT | NUMBER OF EVALUATIONS | JUDGEMENT RESULT | NUMBER OF EVALUATIONS |
| Ti30~80/ Ni30~80/ Ag100~300 | ◎ | 6/6 | ○ | 9/9 |
| Ti50~150/ Ag10~100 | ○ | 6/6 | ○ | 6/6 |
| Ni50~150 | Δ | 4/4 | x | 2/2 |

Here, "Ti 30 to 80/Ni 30 to 80/Ag 100 to 300" in Table 2 indicates that the Ti film having a thickness of about 30 to 80 nm, the Ni film having a thickness of about 30 to 80 nm, and the Ag film having a thickness of about 100 to 300 nm are formed sequentially on the backside of the semiconductor chip as a metal film. "Ti 50 to 150/Ag 10 to 100" indicates that the Ti film having a thickness of about 50 to 150 nm and the Ag film having a thickness of about 10 to 100 nm are formed sequentially as a metal film. "Ni 50 to 150" indicates that the Ni film having a thickness of about 50 to 150 nm is formed as a metal film. Here, the denominator of a fraction described in the boxes of the number of evaluations indicates the number of evaluated specimens and the numerator indicates the number of specimens for which the judgment result was obtained. In each combination, the denominator and the numerator are the same and this means that there is no fluctuation in the judgment result.

As shown in Table 2, when the In-10% Ag pellet was used, excellent melting properties could be obtained irrespective of the kinds of metal films. When the laminated film was used as a metal film, there was no peeling of the film in the scratching test. On the other hand, when the Pb-63% Sn pellet was used and the single layer film was used as a metal film, the melting properties were low and there occurred peeling of the film in the scratching test.

The In alloy film on the metal film functions as a bonding material and a thermal interface material. Then, from the fact that the melting properties of the In alloy are excellent, it can be considered that the mutual solubility with the metal film therebeneath and the degree of alloying are high. To improve the reliability of the metal bonding, a high mutual solubility, a high degree of alloying, and a high degree of compounding are necessary. Consequently, it can be said that if the melting properties of the In alloy film are excellent, the thermal conductivity between the heat spreader and the semiconductor chip is excellent. On the other hand, when the melting properties are low in such a case where the PbSn pellet is placed on the single layer metal film, the degree of spreading of wettability is low and it is likely that the pellet peels off from the metal film after solidification.

For the evaluation of bonding strength, the heat spreader was metal-bonded onto the semiconductor chip using the In-10% Ag pellet or the Pb-63% Sn pellet and its strength was measured. At the time of the measurement, a test jig was fixed onto the surface of the semiconductor chip using adhesive agent (epoxy resin) without using the ceramic substrate and the destruction test was conducted. If the strength of the metal-bonding is not large enough, peeling occurs at the boundary between the In-10% Ag film or the Pb-63% Sn film and the heat spreader. On the other hand, if the strength of the metal-bonding is large enough, it is unlikely that peeling occurs on the boundary but peeling occurs at the adhesive agent that fixes the test jig onto the semiconductor chip. In other words, destruction occurs at a point where the bonding strength is small as a start point. Consequently, by evaluating the destruction boundary and measuring the strength applied at the time of destruction, it is possible to evaluate the state of the metal-bonding.

In the evaluation of the bonding strength, evaluation was made for combinations of those having excellent melting properties. The result is shown in Table 3.

TABLE 3

| METAL FILM | In - 10% Ag | | | Pb - 63% Sn |
|---|---|---|---|---|
| Ti30~80/ Ni30~80/ Ag100~300 | 68 (kgf) | | | 57 (kgf) |
| Ti50~150/ Ag10~100 | 103 (kgf) | 95 (kgf) | 87 (kgf) | 62 (kgf) |
| Ni50~150 | 13 (kgf) | | | PEELING |

As shown in Table 3, when the In-10% Ag film was formed and the laminated film was used as a metal film, the sufficient bonding strength could be obtained and at the same time, peeling occurred at the adhesive agent, and peeling did not occur in the vicinity of the In-10% Ag film. On the other hand, when the Pb-63% Sn film was formed and the single layer film was used as a metal film, peeling did not occur at the adhesive agent but occurred in the Pb-63% Sn film.

From these results, it can be concluded that it is possible to obtain metal-bonding equipped with high melting properties (lubrication behavior) and sufficient strength by using, especially, a laminated film as a metal film, for example, by using a laminated film composed of a Ti film and an Ag film or a laminated film composed of a Ti film, a Ni film, and an Ag film, and by using the In-10% Ag pellet as the In alloy pellet.

Patent Document 2 discloses bonding of a circular disk-like enforcement material made of W to a silicon semiconductor rectifying device using In or the In-5 weight % Ag alloy, however, the W material does not function as a heat diffusion member. This is because the thermal conductivity of W is as low as 1.74 $(W \cdot cm^{-1} \cdot k^{-1})$. Further, the melting point of In and In-5 weight % Ag alloy described in Patent Document 2 is about 140 to 150° C. and therefore this cannot be applied to the recent semiconductor chip having high capabilities from the standpoint of heat resistance.

According to the present invention, the bonding of the semiconductor chip and the heat diffusion member, such as a heat spreader, is performed using an In alloy film. Because of this, it is possible to efficiently dissipate heat from the semiconductor chip.

What is claimed is:

1. A semiconductor device comprising:
   a semiconductor chip;
   a substrate mounting said semiconductor chip;
   a heat diffusion member arranged over said semiconductor chip and said substrate, said semiconductor chip and said heat diffusion member being bonded with an In alloy film; and
   a metal film located between said In alloy film and said semiconductor chip,
   wherein said metal film includes an alloy film composed of two or more kinds of elements selected from a group consisting of Ti, Ni, Pd, V, and Ag, and the In alloy film includes an alloy film composed of the two or more kinds of the elements included in the metal film;
   wherein a thickness of said In alloy film is 0.1 mm to 0.8 mm.

2. The semiconductor device according to claim 1, wherein said In alloy film contains at least one kind of element selected from a group consisting of Sn, Pb, Ag, and Bi.

3. The semiconductor device according to claim 1, wherein a ratio of elements other than In in said In alloy film is 0.1 atom % to 20 atom %.

4. The semiconductor device according to claim 1, wherein said In alloy film contains Ag of 5 atom % to 20 atom %.

5. The semiconductor device according to claim 1, wherein a thermal conductivity of said heat diffusion member is equal to or more than 2 $(W \cdot cm^{-1} \cdot k^{-1})$.

6. The semiconductor device according to claim 1, wherein said heat diffusion member is bonded to said substrate via a resin.

* * * * *